US008384649B2

(12) United States Patent
Shang

(10) Patent No.: US 8,384,649 B2
(45) Date of Patent: Feb. 26, 2013

(54) GATE DRIVE DEVICE FOR A LIQUID CRYSTAL DISPLAY INCLUDING MULTIPLE STAGES OF SHIFT REGISTER UNITS

(75) Inventor: Guangliang Shang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 328 days.

(21) Appl. No.: 12/730,387

(22) Filed: Mar. 24, 2010

(65) Prior Publication Data

US 2010/0245301 A1 Sep. 30, 2010

(30) Foreign Application Priority Data

Mar. 27, 2009 (CN) .......................... 2009 1 0081003

(51) Int. Cl.
*G09G 3/36* (2006.01)
*G11C 19/00* (2006.01)
(52) U.S. Cl. ......................................... 345/100; 377/64
(58) Field of Classification Search .................. 345/100; 377/64
See application file for complete search history.

(56) References Cited

U.S. PATENT DOCUMENTS

| 6,124,840 | A * | 9/2000 | Kwon | 345/100 |
|---|---|---|---|---|
| 7,750,715 | B2 * | 7/2010 | Hsu et al. | 327/296 |
| 8,089,446 | B2 * | 1/2012 | Pak et al. | 345/100 |
| 2004/0041763 | A1 * | 3/2004 | Kodama et al. | 345/87 |
| 2006/0109232 | A1 * | 5/2006 | Kuo | 345/100 |
| 2006/0267909 | A1 * | 11/2006 | Hsu et al. | 345/100 |
| 2008/0024692 | A1 | 1/2008 | Choi | |
| 2008/0055225 | A1 * | 3/2008 | Pak et al. | 345/100 |
| 2008/0074379 | A1 | 3/2008 | Kim et al. | |
| 2008/0122829 | A1 * | 5/2008 | Park | 345/213 |
| 2008/0278467 | A1 * | 11/2008 | Hwang et al. | 345/87 |
| 2009/0009497 | A1 * | 1/2009 | Lee et al. | 345/90 |
| 2009/0040168 | A1 * | 2/2009 | Liu | 345/100 |
| 2009/0086116 | A1 * | 4/2009 | Pak | 349/38 |
| 2010/0001941 | A1 * | 1/2010 | Shin et al. | 345/98 |
| 2010/0134172 | A1 * | 6/2010 | Hsu et al. | 327/296 |

FOREIGN PATENT DOCUMENTS

| CN | 101191920 A | | 6/2008 |
|---|---|---|---|
| CN | 101192381 A | | 6/2008 |
| CN | 101383133 A | | 3/2009 |
| JP | 2006-331633 A | | 12/2006 |
| KR | 10-2005-037709 A | * | 4/2005 |
| KR | 20080027620 A | | 3/2008 |

* cited by examiner

*Primary Examiner* — Adam J Snyder
(74) *Attorney, Agent, or Firm* — Ladas & Parry LLP

(57) ABSTRACT

A gate drive device for liquid crystal display including multiple stages of shift register units and plurality of clock signal lines, said plurality of clock signal lines all being connected to the multiple stages of shift register units, to enable the multiple stages of shift register units to generate a gate drive signal, each stage of shift register unit all includes a signal output terminal, a first discharge circuit modular is connected between the signal output terminal for the i-th stage of shift register unit and the signal output terminal for the (i+1)-th stage of shift register unit, said first discharge circuit modular is used to cause the charges of a high level signal outputted from the signal output terminal for the i-th stage of shift register unit to be discharged to the signal output terminal for the (i+1)-th stage of shift register unit.

5 Claims, 8 Drawing Sheets

For the first stage of shift register unit and the last stage of shift register unit ($SR_{n+1}$), the gate drive signal output terminal for each stage of shift register unit is connected to the reset signal input terminal for a i-th stage of shift register unit adjacent thereto and the signal input terminal for a (i+1)-th stage of shift register unit adjacent thereto, a frame start signal (STV) is inputted from the signal input terminal (INPUT) of the first stage of shift register unit, the signal output terminal ($OUT_{n+1}$) of the last stage of the shift register unit ($SR_{n+1}$) is connected to the reset signal input terminal (RESETIN) of the i-th stage of shift register unit (SRn) adjacent thereto as well as the reset signal input terminal (RESETIN) thereof. The signal output terminal for each stage of the shift register unit is connected to a gate line (GL), for providing a gate drive signal for the gate line. The high voltage signal input terminal (VDDIN) of each stage of the shift register unit is connected to a high voltage signal line A where a high voltage signal (VDD) is inputted; the low voltage signal input terminal (VSSIN) is connected to a low voltage signal line B where a low voltage signal (VSS) is inputted; the first clock signal input terminal (CLKIN) is connected to a first clock signal line C where a first clock signal (CLK) is inputted; the second clock signal input terminal (CLKBIN) is connected to a second clock signal line D where a second clock signal (CLKB) is inputted.

In FIG. 1b, the signal output terminal (OUT) of each stage of the shift register unit outputs a high level every period of a frame, thereby controlling the thin film transistor (TFT) of the corresponding row to be turned on, such that progressive scanning of the liquid crystal display is implemented. The high level outputted from the last stage of the shift register unit ($SR_{n+1}$) is used as the reset signal for both of itself and the previous stage of the shift register unit ($SR_n$). In the prior art, the delay of the gate drive signal is large. FIG. 1c is a comparative diagram of the gate drive signal outputted from the signal output terminal ($OUT_n$) of FIG. 1b versus the second clock signal. It can be seen from the FIG. 1c, there is a large delay between the rising edge of the gate drive signal outputted from the signal output terminal ($OUT_n$) of the n-th stage of the shift register unit ($SR_n$) and the rising edge of the second clock signal (CLKB), wherein td is a timing difference between the 50% of the rising edge of the second clock signal (CLKB) and the 50% of the rising edge of the gate drive signal outputted from the signal output terminal ($OUT_n$). Also, in the prior art, each signal output terminal is directly discharged to a low level after being charged to a high level by a power supply, thus the charged and discharged amounts are large, and the high level signal outputted from the each signal output terminal is not sufficiently utilized which causes the power consumption of the gate drive device to be large.

SUMMARY

The embodiments of present invention are intended to address the problems existing in the prior art, and provides a gate drive device of a liquid crystal display, which is capable of reducing the delay of the gate drive signal outputted from the each stage of shift register unit, and with a lower power consumption.

An embodiment of the present invention provides a gate drive device for a liquid crystal display, including multiple stages of shift register units and a plurality of clock signal lines, each of said plurality of clock signal lines being connected to the multiple stages of shift register units, to enable the multiple stages of shift register units to generate a gate drive signal, each stage of shift register unit including a signal output terminal, wherein a first discharge circuit modular being connected between the signal output terminal for the i-th stage of shift register unit and the signal output terminal for the (i+1)-th stage of shift register unit, said first discharge circuit modular being for causing the charges of a high level signal outputted from the signal output terminal for the i-th stage of shift register unit to be discharged to the signal output terminal for the (i+1)-th stage of shift register unit, wherein $1 \leq i \leq$ the number of the stages of shift register units−1.

An embodiment of the present invention also provides a gate drive device for a liquid crystal display, comprising multiple stages of shift register units and a plurality of clock signal lines, each of said plurality of clock signal lines being connected to the multiple stages of shift register units to enable the multiple stages of shift register units to generate a gate drive signal, wherein each of said plurality of clock signal lines comprising a clock signal primary line and a clock signal secondary line which being connected in parallel; a discharge circuit modular being connected between two clock signal lines among said plurality of clock signal lines, the discharge circuit modular being for causing the charges of a high level signal on the clock signal primary line of one of the two clock signal lines to be discharged to the clock signal primary line of the other of the two clock signal lines.

An embodiment of the present invention provides a gate drive device of the liquid crystal display, which enables the charges of a high level signal outputted from the signal output terminal for the i-th stage of the shift register unit to be discharged to the signal output terminal for the (i+1)-th stage of the shift register unit by connecting a first discharge circuit modular between the signal output terminal for the i-th stage of the shift register unit and the signal output terminal for the (i+1)-th stage of the shift register unit, which can reduce the delay of the gate drive signal outputted from the (i+1)-th stage of the shift register unit, and effectively utilize the high level signal outputted from the shift register unit, thus the power consumption can be reduced. By setting a second discharge circuit modular between two clock signal lines, it makes that the charges of the high level signal can be discharged to the clock signal of another clock signal primary line when the clock signal of one clock signal primary line is falling, it makes that the level of the clock signal of another clock signal primary line can rise fast and reduce the delay of the rising edge, thus reducing the delay of the gate drive signal outputted from the shift register unit.

Below, the technical solutions of the present invention will be described in details through the accompanying drawings and embodiments.

BRIEF DESCRIPTION OF THE DRAWINGS

FIG. 6b is an enlarged comparative diagram of CLK, CLK', CLKB and CLKB' of FIG. 6a.

DETAILED DESCRIPTION OF THE EMBODIMENTS

Figure 1A:
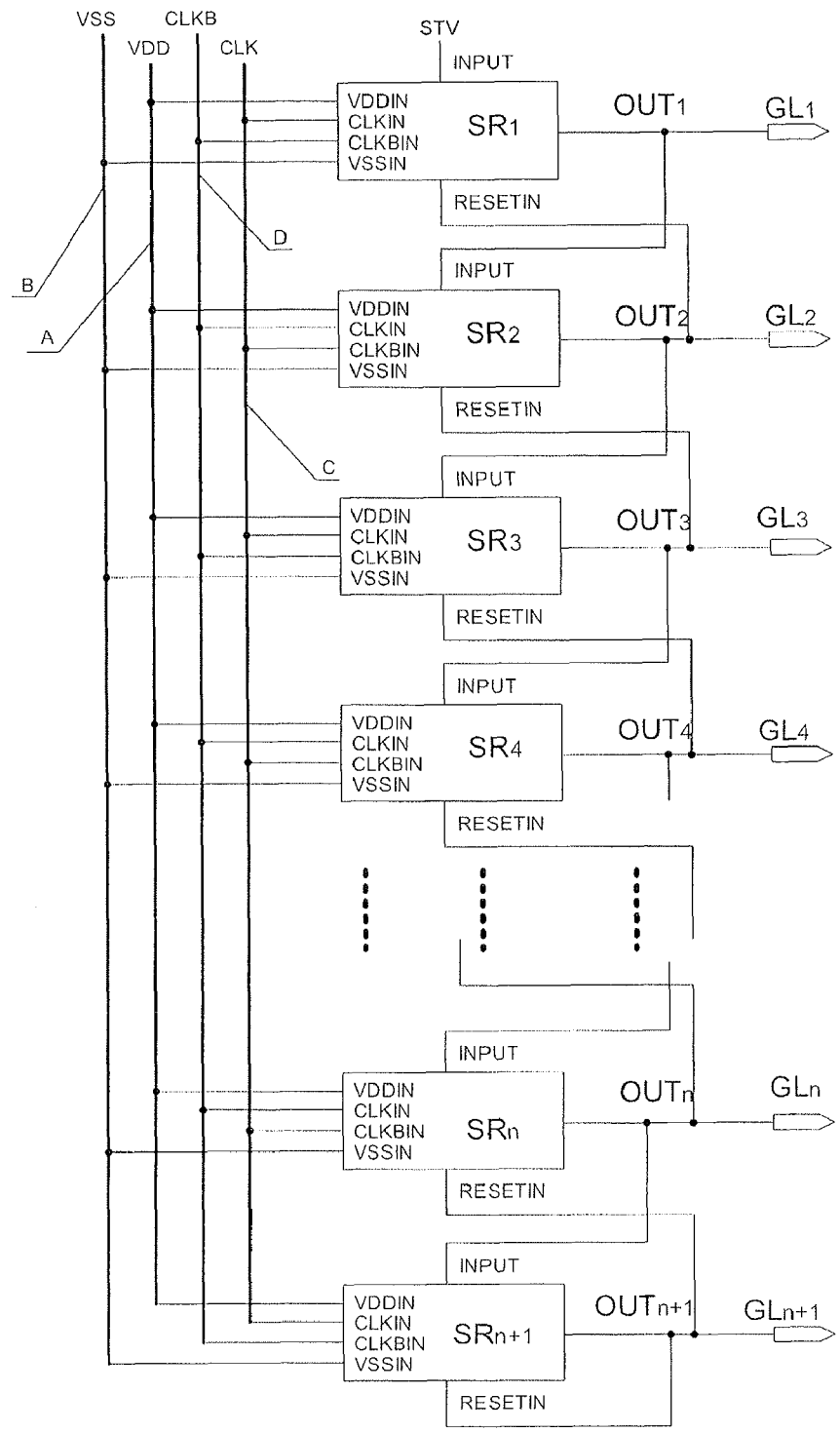
FIG. 1a is an illustrative diagram of a structure of the gate drive device of the liquid crystal display in the prior art.
Figure 1B:
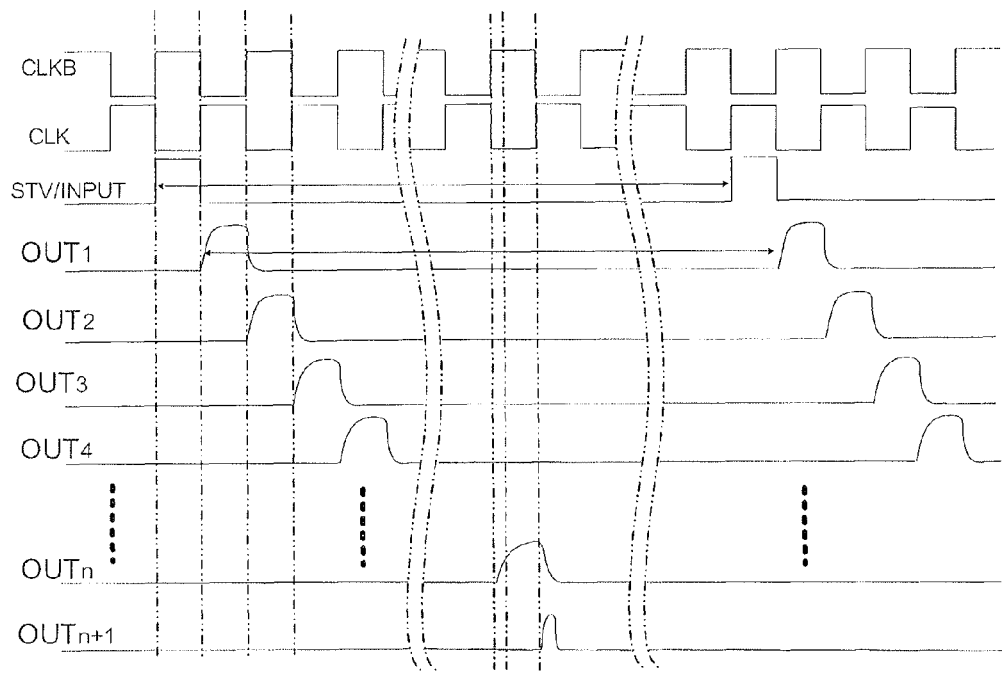
FIG. 1b is a timing diagram of the shift register unit in the prior art.
Figure 1C:
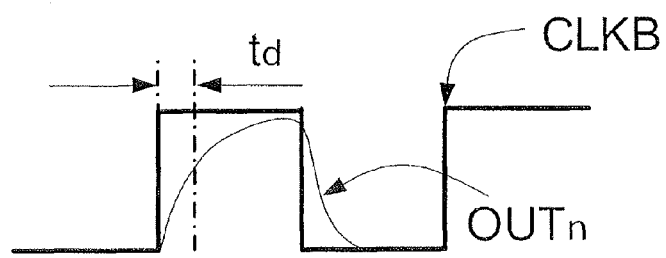
FIG. 1c is a comparative diagram of the gate drive signal outputted from the signal output terminal ($OUT_n$) of FIG. 1b vs. the second clock signal in the prior art.
Figure 2:
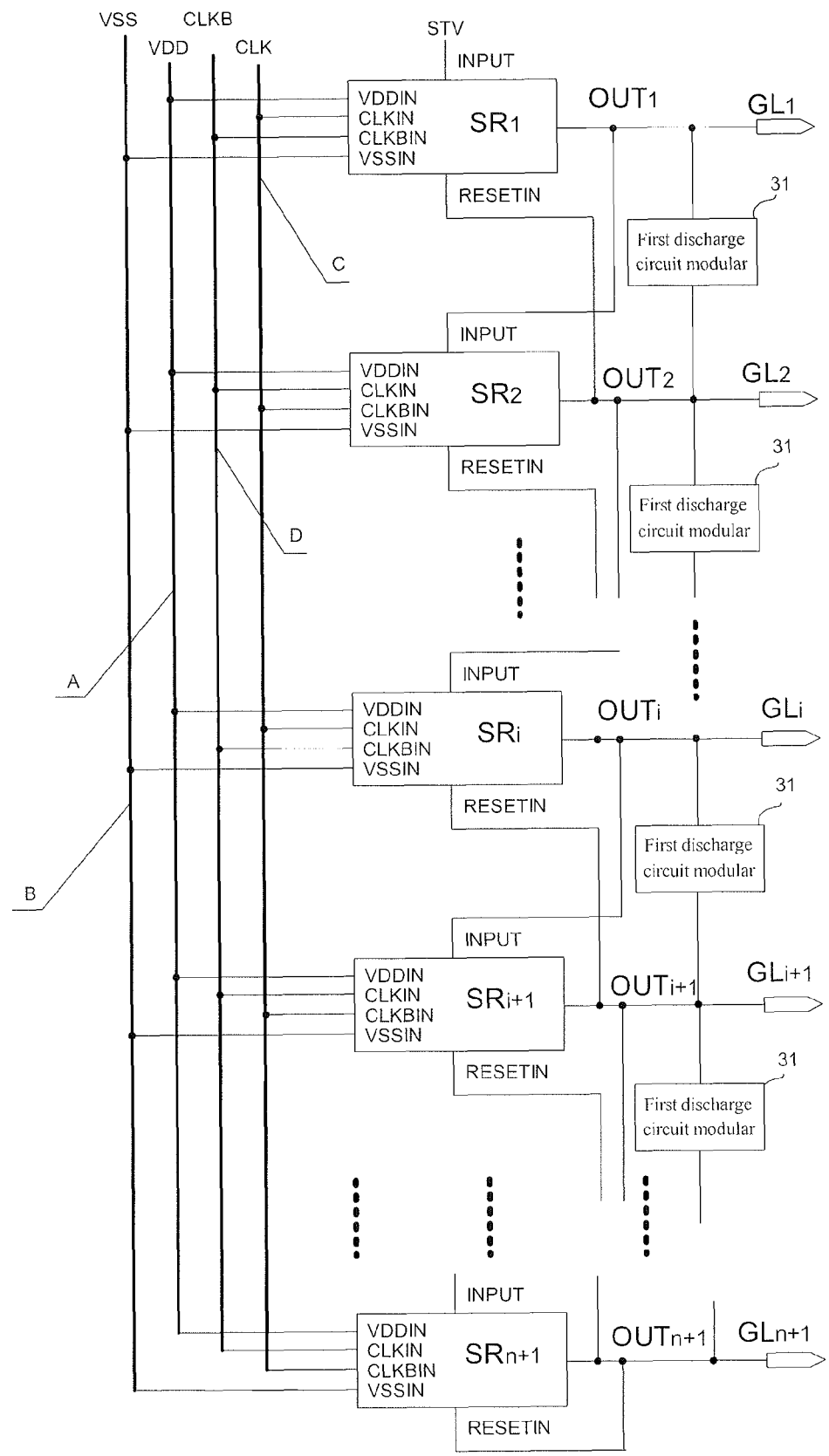
FIG. 2 is an illustrative diagram of a structure of the gate drive device of the liquid crystal display according to a first embodiment of the present invention.

FIG. 2 is an illustrative diagram of a structure of the gate drive device of the liquid crystal display according to a first embodiment of the present invention. Said device includes multiple stages of shift register units, each stage of the shift register unit includes a signal input terminal and a signal output terminal, a first discharge circuit modular 31 is connected between the signal output terminal for the i-th stage of the shift register unit and the signal output terminal for the (i+1)-th stage of the shift register unit, the first discharge circuit modular 31 is used to enable the charges of a high level signal outputted from the i-th stage of the shift register unit to be discharged to the signal output terminal for the (i+1)-th stage of shift register unit. The gate drive device of a liquid crystal display enables to cause the charges of a high level signal outputted from the i-th stage of the shift register unit to be applied to the signal output terminal for the (i+1)-th stage of shift register unit through a first discharge circuit modular, by setting the first discharge circuit modular between the signal output terminals of the i-th stage of the shift register unit and the (i+1)-th stage of the shift register unit, so as to reduce the delay of the gate drive signal outputted from each stage of the shift register unit.

Figure 3:
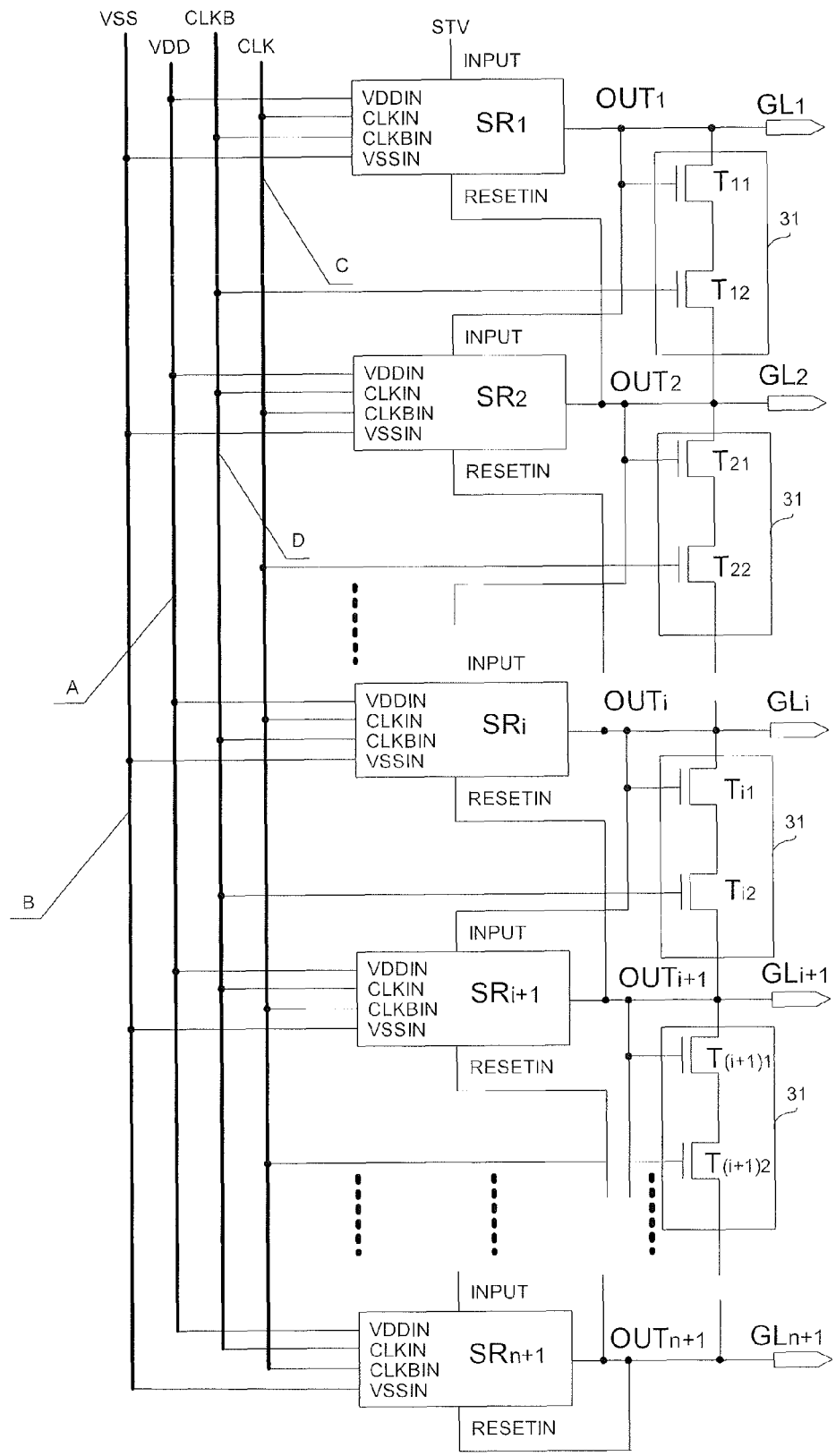
FIG. 3 is an illustrative diagram of a structure of the gate drive device of the liquid crystal display according to a second embodiment of the present invention.

FIG. 3 is an illustrative diagram of a structure of the gate drive device of the liquid crystal display according to a second embodiment of the present invention. In FIG. 3, the first discharge circuit modular 31 includes two thin film transistors, for the i-th (i is a positive integer, and 0<i<n+1) stage of the shift register unit, the drain and gate of the first thin film transistor ($T_{i1}$) are connected to the signal output terminal ($OUT_i$) of the i-th stage of the shift register unit ($SR_i$), a source of the second thin film transistor ($T_{i2}$) is connected to the signal output terminal ($OUT_{i+1}$) of the (i+1)-th stage of the shift register unit ($SR_{i+1}$), a drain thereof is connected to the source of the first thin film transistor ($T_{i1}$). When i is an odd number, the gate of the second thin film transistor ($T_{i2}$) is connected to the second clock signal line; when i is an even number, the gate of the second thin film transistor ($T_{i2}$) is connected to the first clock signal line. The (n+1)-th stage of the shift register unit ($SR_{n+1}$) is used to provide a reset signal to the n-th stage of the shift register unit, while the (n+1)-th stage of the shift register unit ($SR_{n+1}$) is not for driving the gate line, thus the first thin film transistor and the second thin film transistor may not be added into the (n+1)-th stage of the shift register unit ($SR_{n+1}$).

Figure 4:
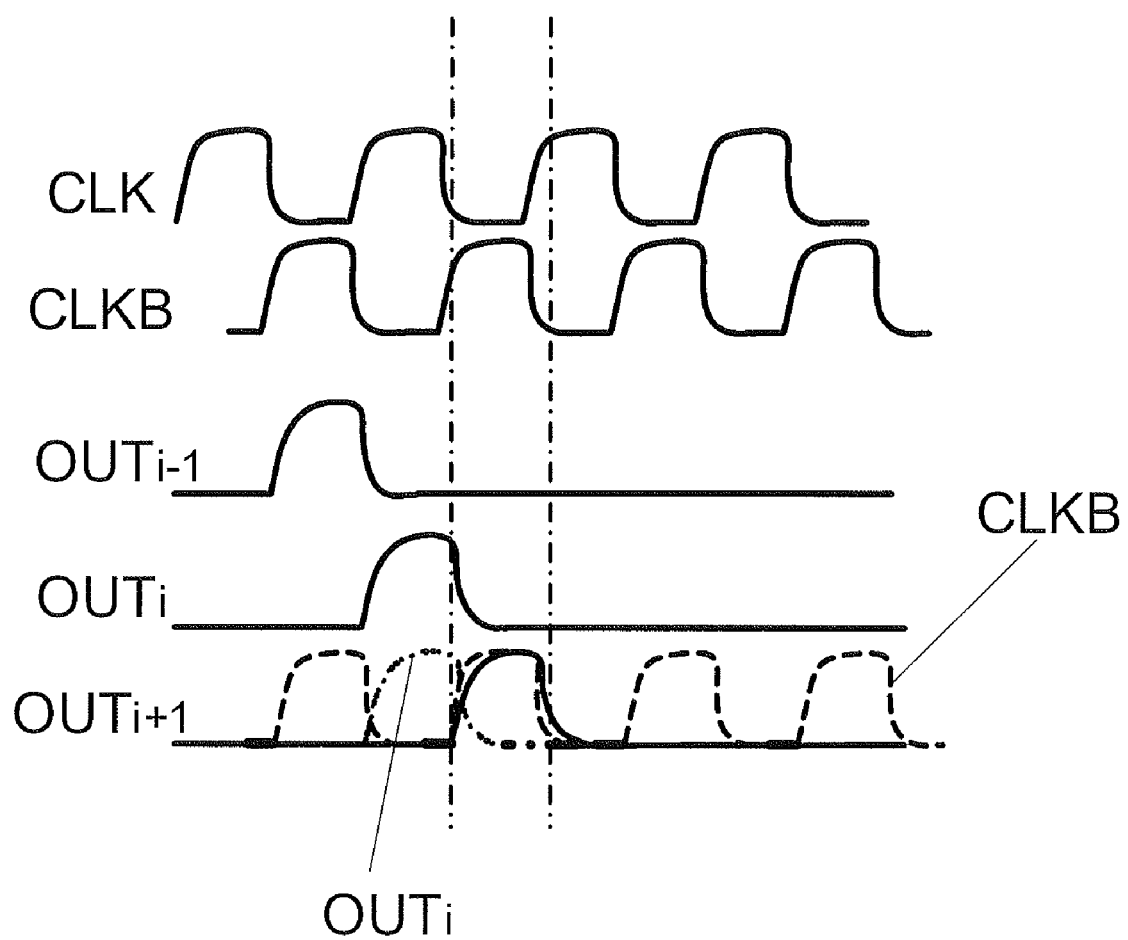
FIG. 4 is a timing diagram of a portion of i-th stage of the shift register unit ($SR_i$) and (i+1)-th stage of the shift register unit ($SR_{i+1}$) of FIG. 3.

FIG. 4 is a timing diagram of a portion of i-th stage of the shift register unit ($SR_i$) and (i+1)-th stage of the shift register unit ($SR_{i+1}$) of FIG. 3, the operation principal of the second embodiment of the present invention is described with reference to FIG. 3 and FIG. 4.

When the level of the gate drive signal outputted from the signal output terminal ($OUT_i$) of the i-th stage of the shift register unit ($SR_i$) becomes low, the gate drive signal outputted from the signal output terminal ($OUT_{i+1}$) of the (i+1)-th stage of the shift register unit ($SR_{i+1}$) still has a low level, while the second clock signal (CLKB) is in a rising edge, thus the second thin film transistor ($T_{i2}$) is turned on. As the gate drive signal outputted from the signal output terminal (OUT) of the i-th stage of the shift register unit ($SR_i$) becomes a high level, and the gate drive signal outputted from the signal output terminal ($OUT_{i+1}$) of the (i+1)-th stage of the shift register unit ($SR_{i+1}$) still has a low level, the first thin film transistor ($T_{i1}$) is turned on. In this way, the charges of the high level signal outputted from the signal output terminal ($OUT_i$) of the i-th stage of the shift register unit ($SR_i$) is discharged to the signal output terminal ($OUT_{i+1}$) of the (i+1)-th stage of the shift register unit ($SR_{i+1}$) through the first thin film transistor ($T_{i1}$) and the second thin film transistor ($T_{i2}$), so as to reduce the delay of the gate drive signal outputted from the (i+1)-th stage of the shift register unit ($SR_{i+1}$). When the level of the signal outputted from the signal output terminal ($OUT_i$) of the i-th stage of the shift register unit ($SR_i$) is lower than the level of the signal outputted from the signal output terminal ($OUT_{i+1}$) of the (i+1)-th stage of the shift register unit ($SR_{i+1}$), the first thin film transistor ($T_{i1}$) is turned off. At this time, the signal outputted from the signal output terminal ($OUT_i$) of the i-th stage of the shift register unit ($SR_i$) no longer affects the signal outputted from the signal output terminal ($OUT_{i+1}$) of the (i+1)-th stage of the shift register unit ($SR_{i+1}$).

In FIG. 3, two thin film transistors are connected between the adjacent two stages of shift register unit, such that the high level signal outputted from the signal output terminal for each stage of the shift register unit can not only drive the gate line, but also the charges of the signal can be discharged to the signal output terminal for the adjacent next stage of shift register unit, thus the delay of the signal outputted from the signal output terminal for the adjacent next stage of shift register unit can be reduced. Also, it makes that the high level signal outputted from the signal output terminal for each stage of shift register unit can be effectively utilized without being wasted.

In the embodiment illustrated in FIG. 3, the gate drive device of the liquid crystal display includes two clock signal lines, clock signals inputted on the two clock signal lines are signals which are phase-reversed with each other. In the prior art, the gate drive device of the liquid crystal display can further include more than two clock signal lines. When the gate drive device of the liquid crystal display includes more than two clock signal lines, the gate of the second thin film transistor in the first discharge circuit modular is connected to one of more than two clock signal lines. Which one of the clock signal lines is required to be connected can be determined according to the characteristic of the inputted clock signal. The detailed embodying means is similar to aforementioned embodiments, thus those skilled in the art can obtain the corresponding embodying means based on the description of the aforementioned embodiments of the present invention. Redundant description is omitted.

Figure 5:
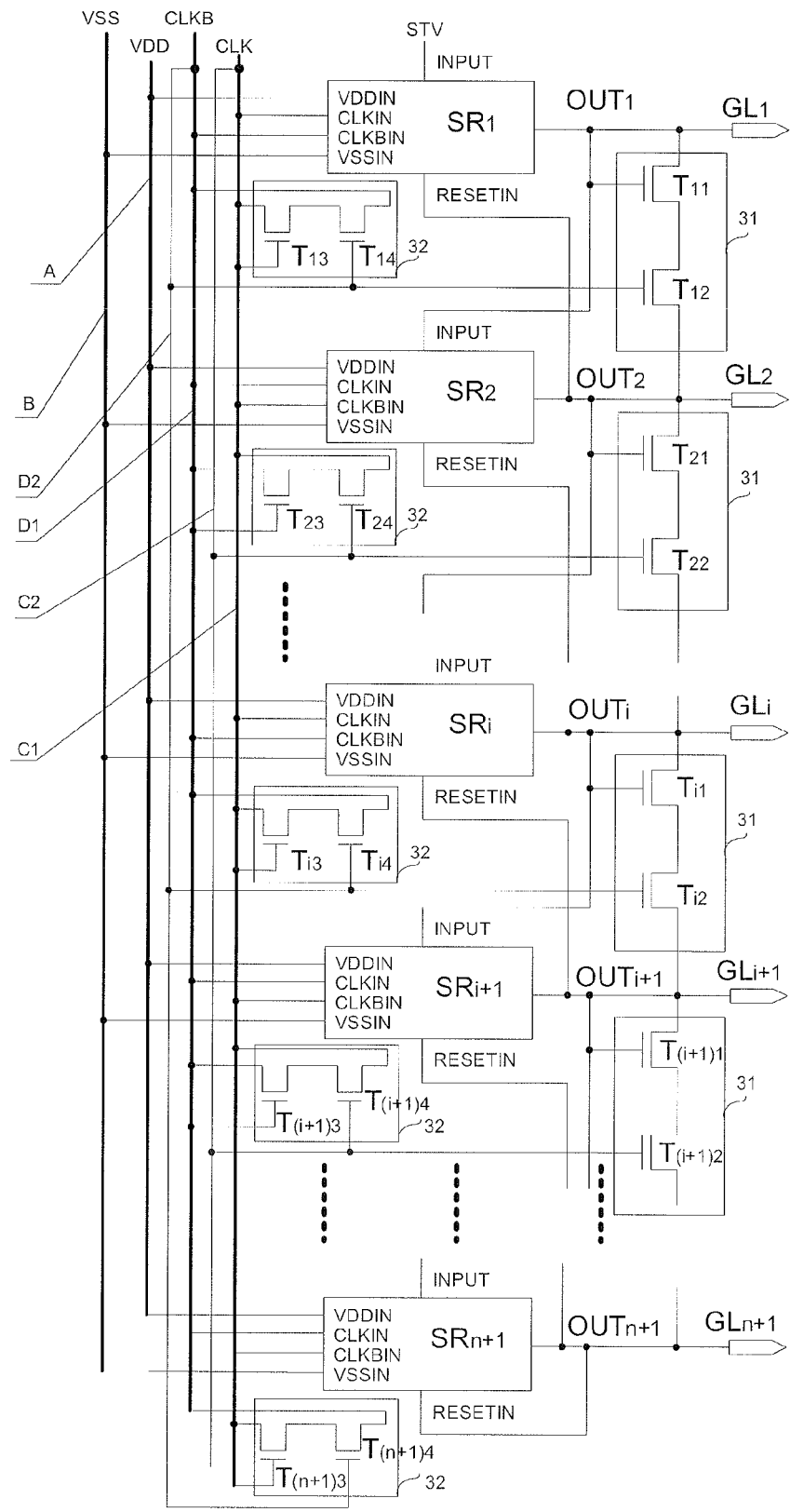
FIG. 5 is an illustrative diagram of a structure of the gate drive device of the liquid crystal display according to a third embodiment of the present invention.

FIG. 5 is an illustrative diagram of a structure of the gate drive device of the liquid crystal display according to a third embodiment of the present invention. The difference between the device illustrated in FIG. 5 and the device illustrated in FIG. 3 is that: in FIG. 5, the first clock signal line includes a first clock signal primary line C1 and a first clock signal secondary line C2, which are connected in parallel. The second clock signal line includes a second clock signal primary line D1 and a second clock signal secondary line D2, which are connected in parallel. The first clock signal primary line C1 and the second clock signal primary line D1 are for providing a clock signal for each stage of shift register unit. In the device provide by FIG. 5, based on the device of FIG. 3, a second discharge circuit modular 32 is connected between the first clock signal primary line C1 and the second clock signal primary line D1. The second discharge circuit modular 32 includes a third thin film transistor and a fourth thin film transistor. For the i-th stage of shift register unit, the source of the third thin film transistor ($T_{i3}$) is connected to the drain of the fourth thin film transistor ($T_{i4}$). When i is an odd number, the gate and the drain of the third thin film transistor ($T_{i3}$) are connected to the first clock signal primary line C1, the gate and the source of the fourth thin film transistor ($T_{i4}$) are connected to the second clock signal secondary line D2 and the second clock signal primary line D1, respectively, the gate of the second thin film transistor ($T_{i2}$) is connected to the second clock signal secondary line D2, the respective connection relationships among the source and drain of the second thin film transistor ($T_{i2}$) and the gate, source and drain of the first thin film transistor ($T_{i1}$) are same as those in FIG. 3. When i is an even number, the gate and drain of the third thin film transistor ($T_{i1}$) are connected to second clock signal primary line D1, the gate and the source of the fourth thin film transistor ($T_{i4}$) are connected to the first clock signal secondary line C2 and the first clock signal primary line C1, respectively, the gate of the second thin film transistor ($T_{i2}$) is connected to the first clock signal secondary line C2, the respective connection relationships among the source and drain of the second thin film transistor ($T_{i2}$) and the gate, source and drain of the first thin film transistor ($T_{i1}$) are same as those in FIG. 3.

Figure 6A:
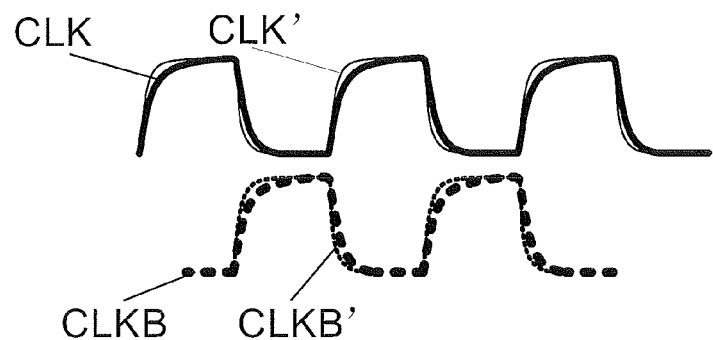
FIG. 6a is a timing diagram of a portion of i-th stage of the shift register unit ($SR_i$) and (i+1)-th stage of the shift register unit ($SR_{i+1}$) of FIG. 5.
Figure 6B:
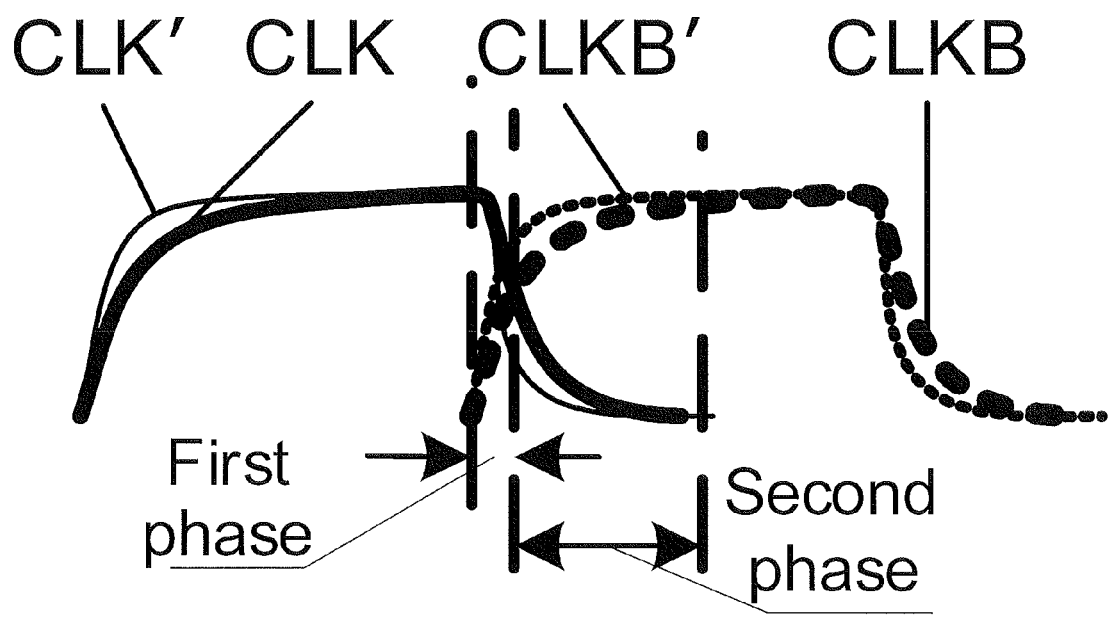

The operation principal of the third embodiment is described below by way of the example of the i-th stage of shift register unit and the (i+1) stage of shift register unit. FIG. 6a is a timing diagram of a portion of the i-th stage of the shift register unit ($SR_i$) and the (i+1)-th stage of the shift register unit ($SR_{i+1}$) of FIG. 5. The first clock signal primary line C1 and the second clock signal primary line D1 are for providing a clock signal for the shift register units, these two clock signal primary lines are usually connected to the thin film transistor with large size, the delay of the rising edge and falling edge of these two clock signal primary lines is larger than that of the clock signal of the two clock signal secondary lines. The first clock signal (CLK) is inputted into the first clock signal primary line C1, and the first clock signal (CLK') is inputted into the first clock signal secondary line C2, the second clock signal (CLKB) is inputted into the second clock signal primary line D1, and the second clock signal (CLKB') is inputted into the second clock signal secondary line D2. FIG. 6b is an enlarged comparative diagram of CLK, CLK', CLKB and CLKB' of FIG. 6a. The operation principal of the third embodiment of the present invention is described in detail below with reference to FIGS. 5, 6a and 6b. In FIG. 6b, in the first phase, when the first clock signal (CLK') in the first clock signal secondary line C2 just becomes low, the first clock signal (CLK) in the first clock signal primary line C1 is still in a higher level, thus the third thin film transistor ($T_{i3}$) of FIG. 5 is turned on. As the second clock signal (CLKB') in the second clock signal secondary line D2 rises fast, such that the second clock signal (CLKB') in the second clock signal secondary line D2 becomes a higher level, thus the fourth thin film transistor ($T_{i4}$) is also turned on. At that time, by means of the first clock signal (CLK) in the first clock signal primary line C1, the charges are discharged to the signal of the second clock signal primary line D1 through the third thin film transistor ($T_{i3}$) and fourth thin film transistor ($T_{i4}$), which makes the level of the second clock signal (CLKB) in the second clock signal primary line D1 can rise fast, which reduces the delay of the rising edge, and further reduces the delay of the gate drive signal outputted from the shift register unit, also reduces the delay of falling edge. In the second phase, when the level of second clock signal (CLKB) in the second clock signal primary line D1 is higher than the level of the first clock signal (CLK) in the first clock signal primary line C1, the third thin film transistor ($T_{i3}$) is inversely turned off, then the first clock signal (CLK) in the first clock signal primary line C1 can no longer discharge to the second clock signal primary line D1. At same time, the charges of CLKB also would not be discharged to the first clock signal primary line C1. In this way, the charge sharing can be achieved between the first clock signal and the second clock signal.

Based on the similar principal, when the second clock signal (CLKB) in the second clock signal secondary line becomes low, the charges can also be discharged to the first clock signal primary line through the third thin film transistor and the fourth thin film transistor, such that the first clock signal (CLK) in the first clock signal primary line can rise fast, reducing the delay of the rising edge, thus reducing the delay of the gate drive signal outputted from the shift register unit.

Adding the third thin film transistor and the fourth thin film transistor makes the first clock signal (CLK) and the second clock signal (CLKB) can share charges, and the amount of charges provided from the power supply may be reduced, thereby reducing the power consumption of the gate drive device of the liquid crystal display.

In FIG. 5, the principal that each stage of the shift register unit discharges the charges of the gate drive signal outputted from the signal output terminal to the adjacent next stage of the shift register unit through the added first thin film transistor and second thin film transistor is similar to that of FIG. 3. Herein repeated description is omitted.

Figure 7:
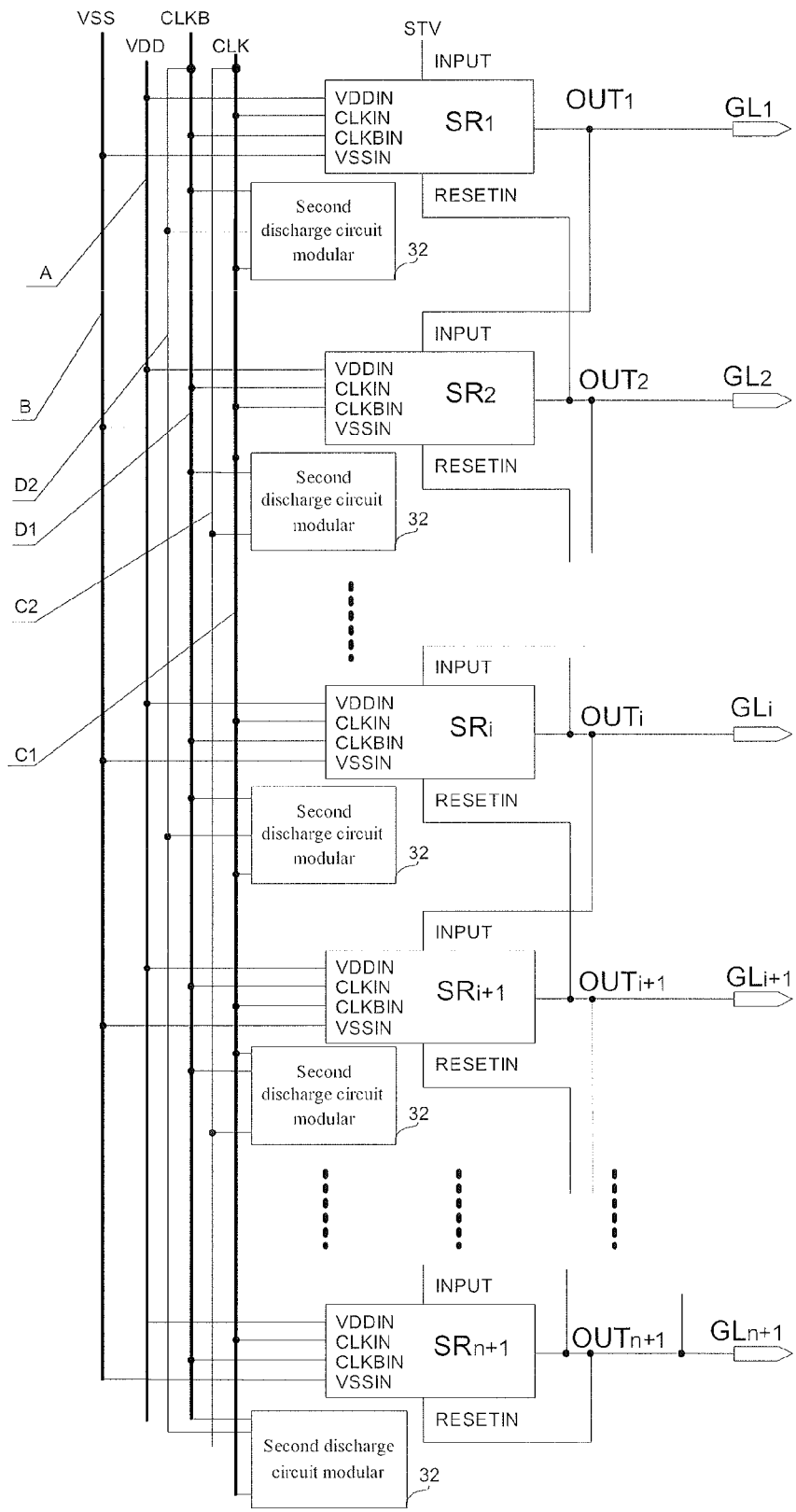
FIG. 7 is an illustrative diagram of a structure of the gate drive device of the liquid crystal display according to a fourth embodiment of the present invention.

FIG. 7 is an illustrative diagram of a structure of the gate drive device of the liquid crystal display according to a fourth embodiment of the present invention. The difference between the device and the embodiment of FIG. 5 is that: FIG. 7 only includes the second discharge circuit modular 32 instead of the first discharge circuit modular 31, while in FIG. 5, both the first discharge circuit modular 31 and the second discharge circuit modular 32 are included. The operation principal of the second discharge circuit modular 32 in FIG. 7 is similar with that in FIG. 5. Herein repeated description is omitted.

In the embodiments of FIG. 5 and FIG. 7, the gate drive device of the liquid crystal display includes two clock signal lines, the clock signals inputted from the two clock signal lines are signals which are phase-reversed with each other. In the prior art, the gate drive device of the liquid crystal display also can include more than two clock signal lines. When the gate drive device of the liquid crystal display includes more than two clock signal lines, the second discharge circuit modular may be connected between two clock signal lines thereamong, such that the charges of the high level signal in one of the clock signal primary line can be discharged to another clock signal primary line. The gate and the drain of the third thin film transistor in the second discharge circuit modular are connected to one clock signal primary line among the two clock signal lines, the drain of the fourth thin film transistor is connected to the source of the third thin film transistor, the source of the fourth thin film transistor is connected to another clock signal primary line among the two clock signal lines, the gate of the fourth thin film transistor is connected to another clock signal secondary line among the two clock signal lines. Detailed implementing manner is similar to the aforementioned embodiments, herein repeated description is omitted.

The embodiment to the present invention provides a gate drive device of the liquid crystal display, which enables the charges of a high level signal outputted from the signal output terminal for the i-th stage of the shift register unit to be discharged to the signal output terminal for the (i+1)-th stage of the shift register unit by connecting a first discharge circuit modular between the signal output terminal for the i-th stage of the shift register unit and the signal output terminal for the (i+1)-th stage of the shift register unit, which can reduce the delay of the gate drive signal outputted from the (i+1)-th stage of the shift register unit, and effectively utilize the high level signal outputted from the shift register unit, thus the power consumption can be reduced. By setting a second discharge circuit modular between two clock signal lines, it makes that the charges of the high level signal can be discharged to the clock signal of another clock signal primary line when the clock signal of one clock signal primary line is falling, it makes that the level of the clock signal of another clock signal primary line can rise fast and reduce the delay of the rising edge, thus reducing the delay of the gate drive signal outputted from the shift register unit.

Finally, it should be noted that, the above embodiments are used only to explain the technical solution of the present invention, not to limit the invention; although the present invention has been described in details with reference to the aforementioned embodiments thereof, it would be obvious to those skilled in the art that he can still make variations to the technical solutions described in the aforementioned embodiments, or equal replacement to partial technical features thereof; such variations or replacements are not to be regarded as rending the nature of the corresponding technical solutions departing from the spirit and scope of the invention.

What is claimed is:

1. A gate drive device for a liquid crystal display, including multiple stages of shift register units and a plurality of clock signal lines, each of said plurality of clock signal lines being connected to the multiple stages of shift register units, to enable the multiple stages of shift register units to generate a gate drive signal, each stage of shift register unit including a signal output terminal, wherein a first discharge circuit modular is connected between the signal output terminal for the i-th stage of shift register unit and the signal output terminal for the (i+1)-th stage of shift register unit, said first discharge circuit modular is used for causing the charges of a high level signal outputted from the signal output terminal for the i-th stage of shift register unit to be discharged to the signal output terminal for the (i+1)-th stage of shift register unit, wherein $1 \leq i \leq$ the number of the stages of shift register units$-1$;

wherein the device further comprises a second discharge circuit modular, wherein a first clock signal line comprises a first clock signal primary line and a first clock signal secondary line, a second clock signal line comprises a the second clock signal primary line and a second clock signal secondary line; said first clock signal primary line and the first clock signal secondary line are connected in parallel; said second clock signal primary line and a second clock signal secondary line are connected in parallel; and wherein the second discharge circuit modular is connected between the first clock signal line and the second clock signal line, the second discharge circuit modular is used for causing the charges of a high level signal on the first clock signal primary line to be discharged to the second clock signal primary line, or for causing the charges of a high level signal in the second clock signal primary line to be discharged to the first clock signal primary line; and wherein the second discharge circuit modular comprises a third thin film transistor and a fourth thin film transistor;

for each of the odd number stages of shift register unit of the multiple stages of shift register units, both of the gate and drain of the third thin film transistor are connected to the first clock signal primary line, the drain of the fourth thin film transistor is connected to the source of the third thin film transistor, the source of the fourth thin film transistor is connected to the second clock signal primary line, the gate of the fourth thin film transistor is connected to the second clock signal secondary line, and the gate of the second thin film transistor is connected to the second clock signal secondary line; and for each of the even number stages of shift register unit of the multiple stages of shift register units, both of the gate and drain of the third thin film transistor are connected to the second clock signal primary line, the drain of the fourth thin film transistor is connected to the source of the third thin film transistor, the source of the fourth thin film transistor is connected to the first clock signal primary line, the gate of the fourth thin film transistor is connected to the first clock signal secondary line, and the gate of the second thin film transistor is connected to the first clock signal secondary line.

2. The device as claimed in claim 1, wherein said first discharge circuit modular comprises a first thin film transistor and a second thin film transistor;

both of the gate and the drain of the first thin film transistor are connected to the signal output terminal for the i-th stage of shift register unit; and the drain of the second thin film transistor is connected to the source of the first thin film transistor, the source of the second thin film transistor is connected to the signal output terminal for the (i+1)-th stage of the shift register unit, and the gate of the second thin film transistor is connected to one of the plurality of the clock signal lines.

3. The device as claimed in claim 2, wherein said plurality of the clock signal lines comprise said first clock signal line and said second clock signal line, the clock signal inputted in the first clock signal line and the clock signal inputted in the second clock signal line are signals which are phase-reversed with respect to each other;

for each of the odd number stages of shift register unit of the multiple stages of shift register units, the gate of the second thin film transistor is connected to the second clock signal line; and for each of the even number stages of shift register unit of the multiple stages of shift register units, the gate of the second thin film transistor is connected to the first clock signal line.

4. A gate drive device for a liquid crystal display, comprising multiple stages of shift register units and a plurality of clock signal lines, each of said plurality of clock signal lines being connected to the multiple stages of shift register units to enable the multiple stages of shift register units to generate a gate drive signal, wherein each of said plurality of clock signal lines comprises a clock signal primary line and a clock signal secondary line which are connected in parallel; and wherein a discharge circuit modular is connected between two clock signal lines among said plurality of clock signal lines, and the discharge circuit modular is used for causing the charges of a high level signal on the clock signal primary line of one of the two clock signal lines to be discharged to the clock signal primary line of the other of the two clock signal lines, wherein the discharge circuit modular comprises a first thin film transistor and a second thin film transistor; and wherein both of the gate and drain of the first thin film transistor are connected to the clock signal primary line of one of the two clock signal lines, the drain of the second thin film transistor is connected to the source of the first thin film transistor, the source of the second thin film transistor is connected to the clock signal primary line of the other of the two clock signal lines, and the gate of the second thin film transistor is connected to the clock signal secondary line of the other of the two clock signal lines.

5. The device as claimed in claim 4, wherein said, two clock signal lines comprise a first clock signal line and a second clock signal line;

said first clock signal line comprises a first clock signal primary line and a first clock signal secondary line, and said second clock signal line comprises a the second clock signal primary line and a second clock signal secondary line;

said first clock signal primary line and the first clock signal secondary line are connected in parallel, and said second clock signal primary line and a second clock signal secondary line are connected in parallel;

for each of the odd number stages of shift register unit of the multiple stages of shift register units, both of the gate and drain of the first thin film transistor are connected to the first clock signal primary line, the drain of the second thin film transistor is connected to the source of the first thin film transistor, the source of the second thin film transistor is connected to the second clock signal primary line, and the gate of the second thin film transistor is connected to the second clock signal secondary line; and for each of even number stages of shift register unit of the multiple stages of shift register units, both of the gate and drain of the first thin film transistor are connected to the second clock signal primary line, the drain of the second thin film transistor is connected to the source of the first thin film transistor, the source of the second thin film transistor is connected to the first clock signal primary line, and the gate of the second thin film transistor is connected to the first clock signal secondary line.

\* \* \* \* \*